US008797031B2

(12) United States Patent
Rehwald et al.

(10) Patent No.: US 8,797,031 B2
(45) Date of Patent: Aug. 5, 2014

(54) MR IMAGING SYSTEM FOR DISCRIMINATING BETWEEN IMAGED TISSUE TYPES

(75) Inventors: Wolfgang G Rehwald, Chapel Hill, NC (US); Enn-Ling Chen, Chapel Hill, NC (US); Raymond J Kim, Chapel Hill, NC (US)

(73) Assignees: Siemens Medical Solutions USA, Inc., Malvern, PA (US); Duke University, Durham, NC (US)

( * ) Notice: Subject to any disclaimer, the term of this patent is extended or adjusted under 35 U.S.C. 154(b) by 428 days.

(21) Appl. No.: 13/298,380

(22) Filed: Nov. 17, 2011

(65) Prior Publication Data

US 2012/0194186 A1 Aug. 2, 2012

Related U.S. Application Data

(60) Provisional application No. 61/436,700, filed on Jan. 27, 2011.

(51) Int. Cl.
*G01V 3/00* (2006.01)

(52) U.S. Cl.
USPC ........................................................ 324/309

(58) Field of Classification Search
USPC .................................................. 324/300–322
See application file for complete search history.

(56) References Cited

U.S. PATENT DOCUMENTS

| 4,383,219 | A | * | 5/1983 | Kaplan .......................... 324/309 |
| 4,728,575 | A | * | 3/1988 | Gamble et al. ............. 424/9.321 |
| 4,914,392 | A | * | 4/1990 | Ugurbil et al. ................ 324/309 |
| 4,947,119 | A | * | 8/1990 | Ugurbil et al. ................ 324/307 |
| 4,988,947 | A | * | 1/1991 | Ugurbil et al. ................ 324/307 |
| 5,019,784 | A | * | 5/1991 | Garwood et al. ............. 324/307 |
| 5,786,692 | A | * | 7/1998 | Maier et al. .................... 324/307 |
| 6,587,708 | B2 | * | 7/2003 | Venkatesan et al. .......... 600/419 |
| 6,885,193 | B2 | * | 4/2005 | Foxall ........................... 324/309 |
| 7,375,520 | B2 | | 5/2008 | Nezafat et al. |
| 7,706,587 | B2 | * | 4/2010 | Haider .......................... 382/128 |
| 7,759,934 | B2 | | 7/2010 | Miyoshi |
| 7,787,930 | B2 | | 8/2010 | Nezafat et al. |
| 8,502,537 | B2 | * | 8/2013 | Corum et al. ................. 324/314 |
| 2006/0253015 | A1 | | 11/2006 | Nezafat et al. |
| 2008/0014149 | A1 | * | 1/2008 | Murthy et al. ............... 424/9.36 |

OTHER PUBLICATIONS

Brittain, J. H., B. S. Hu, et al. (1995). "Coronary Angiography with Magnetization-Prepared T2 Contrast." Magnetic Resonance in Medicine 33(5): 689-696.

(Continued)

*Primary Examiner* — Dixomara Vargas
(74) *Attorney, Agent, or Firm* — Peter R. Withstandley

(57) ABSTRACT

A system provides B1- and B0-insensitive, blood flow and motion-robust T2-preparation and T2-preparation combined with inversion recovery. An MR imaging system discriminates between imaged tissue types based on transverse relaxation time (T2) or transverse relaxation time combined with longitudinal recovery time (T1). A signal generator generates a pulse sequence for T2 preparation or combined T2-preparation with inversion recovery comprising one or more B1 independent refocusing (BIREF-1) pulses for refocusing of magnetization of an anatomical region of interest being imaged, and different combinations of adiabatic or non-adiabatic tip-down and flip-back pulses. Multiple RF coils transmit RF pulses in response to the pulse sequence and acquire RF data in response to transmission of the RF pulses. A processing system processes the RF data to provide a display image indicating different tissue types with enhanced discrimination based on T2 relaxation time difference or combined T2 and T1 time difference.

24 Claims, 9 Drawing Sheets

(56) References Cited

OTHER PUBLICATIONS

Levitt, M. H. and R. Freemann (1981). "Compensation for pulse imperfections in NMR spin-echo experiments." Journal of Magnetic Resonance 43(1): 65-80.

Levitt, M. H. and R. Freemann (1981). "Composite Pulse Decoupling." Journal of Magnetic Resonance 43: 502-507.

Levitt, M. H., R. Freemann, et al. (1982). "Broadband Heteronuclear Decoupling." Journal of Magnetic Resonance 47: 328-330.

Nezafat, R., R. Ouwerkerk, et al. (2009). "Spectrally Selective B1-Insensitive T2 Magnetization Preparation Sequence." Magnetic Resonance in Medicine 61: 1326-1335.

Nezafat, R., M. Stuber, et al. (2006). "B1-insensitive T2 preparation for improved coronary magnetic resonance angiography at 3 T." Magn Reson Med 55(4): 858-64.

Rehwald, W. G., E. Jenista, et al. (2011). "Adiabatic T2-preparation modules optimized for robustness toward cardiac motion and flow—a comparison with existing techniques at 3 Tesla." Journal of Cardiovascular Magnetic Resonance 13(Suppl): O14.

Ugurbil, K., M. Garwood, et al. (1988). "Amplitude- and Frequency/Phase-Modulated Refocusing Pulses that Induce Plane Rotations Even in the Presence of Inhomogeneous B1 Fields." Journal of Magnetic Resonance 78(3): 472-497.

* cited by examiner

10

MR IMAGING SYSTEM FOR DISCRIMINATING BETWEEN IMAGED TISSUE TYPES

This is a non-provisional application of provisional application Ser. No. 61/436,700 filed 27 Jan. 2011, by W. G. Rehwald et al.

FIELD OF THE INVENTION

This invention concerns an MR imaging system for discriminating between imaged tissue types based on transverse relaxation time (T2) or transverse relaxation time (T2) in combination with longitudinal recovery time (T1).

BACKGROUND OF THE INVENTION

In Magnetic Resonance Imaging (MRI) and in particular cardiovascular MRI, "T2-preparation" or "T2-prep" is used to magnetically prepare tissue, for example myocardium (heart tissue), to create image contrast between different tissue types due to their differences in T2. This is also known as T2-weighting. T2 is a time constant describing the decay of transverse magnetization and is a function of local tissue water content, among other parameters. The shorter the tissue T2 value in a region of interest (ROI) the darker the ROI appears in a T2-weighted MR image, and conversely, the longer the T2 in a ROI, the brighter the tissue in that ROI. This allows clinicians to discriminate abnormal regions that have a relatively long T2 value (such as edema), from healthy regions possessing a relatively shorter T2 value. In the heart for example, regions with long T2 are known to occur in the setting of acute myocardial infarction. T2-preparation is also used in coronary angiography to accentuate the signal difference between myocardium and blood. Whereas myocardium is rendered dark by T2-preparation, blood remains bright, improving the image contrast between myocardium and blood. FIG. 1 shows a short-axis T2-weighted image of a canine heart indicating elevated image intensity 103 as a result of edema.

T2-preparation sequences use an initial tip-down radio frequency (RF) pulse to convert a substantial part of the longitudinal magnetization of the imaged volume to transverse magnetization, a combination of time delays and RF pulses designed to refocus this transverse magnetization after some signal decrease through T2 relaxation during these pulses and delays, followed by a final tip-up RF pulse to return a substantial part of the refocused magnetization to longitudinal magnetization. The T2 relaxation between the tip-down and tip-up pulses provides the desired alteration of image contrast between components of the imaged volume with different T2 relaxation rates.

One type of known T2-preparation method, MLEV (Levitt and Freemann 1981; Levitt, Freemann et al, 1982; Brittain, Hu et al. 1995), is adversely affected by inhomogeneities of the MRI magnetic excitation field B1 and/or the static magnetic field B0. These inhomogeneities are exacerbated with increasing field strength. Other known types (Nezafat, Stuber et al. 2006; Nezafat, Derbyshire et al. 2008; Nezafat, Ouwerkerk et al. 2009; Nezafat, Ouwerkerk et al. 2010) are susceptible to motion and blood flow resulting in signal variations known as image inhomogeneity, and in image artifacts within the imaged volume. Specifically for moving organs such as the heart, resulting signal variations across the myocardium can be mistaken for intensity changes due to pathophysiology.

Known MLEV composite pulses Levitt, Freemann et al. 1982; Brittain, Hu et al. 1995) can partially compensate for imperfections in the RF magnetic field B1, but fail to yield a homogeneous tissue preparation at field strengths of 3 T (Tesla) or higher (Rehwald, Jenista et al. 2011).

An improved compensation for imperfections in the RF magnetic field B1 can be achieved with so called adiabatic RF pulses. Adiabatic pulses combine amplitude and frequency modulation of the RF designed to create a rotation of the magnetization in a way that is insensitive to variations of the RF field (B1) strength over a substantial range of RF field strengths.

Known T2-preparations that partially or exclusively employ adiabatic RF pulses are a) a matched pair of adiabatic inversion recovery (IR) pulses (Nezafat, Stuber et al. 2006; Nezafat, Ouwerkerk et al. 2010), and b) a single deconstructed BIR4 (deconstructed B1-insensitive rotation with 4 segments, dBIR4) (Nezafat, Derbyshire et al. 2008; Nezafat, Ouwerkerk et al. 2009).

The matched IR pair method consists of an adiabatic IR pulse followed by a time delay to allow magnetization to evolve, followed by a second identical adiabatic IR pulse. A matched pair of identical adiabatic IR pulses is required for refocusing by IR pulses to work (Nezafat, Stuber et al. 2006; Nezafat, Ouwerkerk et al. 2010), but this requirement is problematic as it may make the method susceptible to motion and flow. Phase errors introduced by the first inversion pulse can only be fully compensated by the second inversion in the absence of motion and flow. With motion and flow present, the resulting tissue preparation, e.g. in the heart, is not homogeneous and blood flow creates artifacts. The longer the time delay between the IR pulses the more the module becomes sensitized to the dephasing effects of motion and blood flow, and the more degraded its image quality.

The dBIR4 module is affected by motion and blood flow causing major artifacts and signal inhomogeneity especially for longer T2-preparation times (above 40 ms) (Rehwald, Jenista et al. 2011). Analogous to described matched IR pair problems, this is likely due to the inability of dBIR4 to fully compensate for phase errors in the presence of motion and flow. This inability increases with larger delays between the adiabatic pulses.

A system according to invention principles addresses the above limitations and has excellent robustness in the presence of motion, flow as well as B1- and B0-inhomogeneity.

SUMMARY OF THE INVENTION

The system provides B1- and B0-insensitive, blood flow and motion-robust T2-preparation and T2-preparation combined with inversion recovery. The system discriminates between imaged tissue types based on transverse relaxation time (T2) or T2 combined with longitudinal relaxation time (T1). The system uses B1 independent refocusing (BIREF-1) pulses as for adiabatic refocusing of magnetization of the anatomical ROI being imaged. BIREF-1 pulses are amplitude- and frequency/phase-modulated 180 degrees plane rotation pulses that can achieve both inversion and refocusing transformations in the presence of large B1 variations. The refocusing transformation is achieved by inverting the effective field halfway through the pulse. Due to this self-refocusing property of BIREF-1, it tolerates large variations in B1 magnitude on resonance, but behaves differently off resonance, meaning in the presence of a poor B0 field. Thus BIREF-1 pulses have the perceived limitation to be susceptible to off-resonance effects, which may be why they are typically not used for clinical imaging or as a core element of a T2-preparation module. The inventors have advantageously recognized that drawbacks of BIREF-1 are not limiting for clinical imaging and are outweighed by advantages such as B1 insensitivity and a self-refocusing property. Additionally, the susceptibility of BIREF-1 to off-resonance is advantageously reduced by a phase-cycling scheme. The system according to invention principles has improved robustness in the presence of B1- and B0-inhomogeneity.

Because BIREF-1 pulses are self-refocusing, they need not be played in pairs and do not require an evolution time as part of the refocusing event. Therefore, their effective refocusing duration is significantly shorter compared to known dBIR4 and matched IR pair systems leading to significantly better motion and flow robustness of the invention. Importantly, the self-refocusing property of BIREF-1 allows for different numbers of refocusing pulses within a pulse sequence module, including odd and even numbers.

Applying the invented system to the imaged anatomical ROI modifies the ROI's magnetization to indicate different tissue types with enhanced discrimination based on the difference of T2 relaxation time. The system also allows for tissue discrimination based on T2 with T1 relaxation time in a combined fashion. This is accomplished by replacing the trailing tip-up RF pulse with a tip-down pulse.

An MR imaging system discriminates between imaged tissue type based on transverse relaxation time (T2). A signal generator generates a pulse sequence for T2 preparation comprising at least one B1-independent refocusing (BIREF-1) pulse for refocusing of magnetization of an anatomical region of interest being imaged. Multiple RF coils transmit RF pulses in response to the pulse sequence and acquire RF data in response to transmission of the RF pulses. A processing system processes the RF data to provide a display image indicating different tissue types with enhanced discrimination based on T2 relaxation time difference.

DETAILED DESCRIPTION OF THE INVENTION

Figure 1:
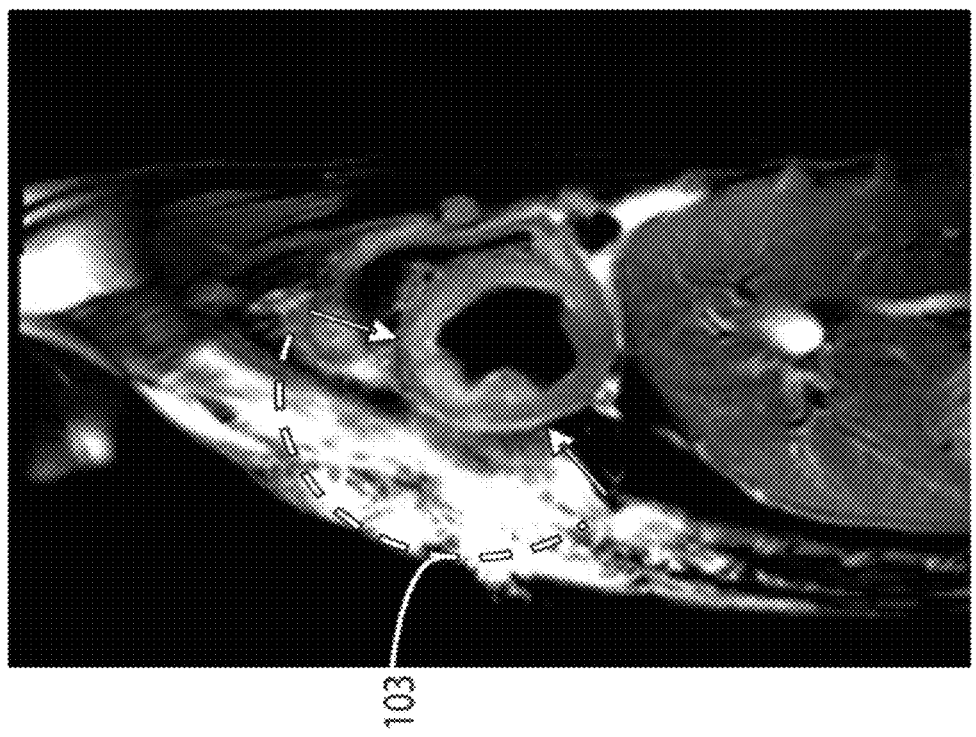
FIG. 1 shows a short-axis T2-weighted image of a canine heart indicating elevated image intensity as a result of edema.

Definitions.

An inversion recovery (IR) pulse inverts longitudinal magnetization from the positive z-axis by 180 degrees to the negative z-axis. IR pulses are used as preparation pulses prior to a main imaging pulse sequence to achieve different kinds of MR contrast (such as T1 weighted, T2 weighted). Adiabatic IR pulses are used to give more uniform contrast throughout an imaging volume than non-adiabatic RF pulses.

iPAT (integrated Parallel Acquisition Techniques) comprises "parallel imaging". It enables faster scanning through reduced phase encoding and addition of RF coil information. An iPAT factor of 2 enables scanning about twice as fast, iPAT factor of 3 enables scanning about three times as fast and so on.

TI=inversion time, the time between an inversion recovery pulse and the next RF excitation pulse. TI determines the image contrast.

$T_1$=the longitudinal (or spin-lattice) relaxation time $T_1$ decay constant.

$T_2$=the transverse (or spin-spin) relaxation time $T_2$ is the decay constant for a proton spin component.

TR=repetition time, the time between successive RF excitation pulses.

FA=flip angle, i.e., an RF flip angle. For an inversion pulse, FA=180 degrees.

Adiabatic RF pulses=RF amplitude and frequency modulated pulses that are insensitive to the effects of B1-inhomogeneity and frequency offset (conventional RF pulses used in MRI are only amplitude modulated).

RF refocusing pulse=A radio frequency (RF) refocusing (or rephasing) pulse returns spins to the same starting phase that they had after an initial excitation RF pulse (an excitation RF pulse brings the magnetization from the longitudinal direction into the transverse plane). At the time point when the spins have reached the same starting phase, the available signal is maximal. That is the time point where the so-called "spin echo" occurs. By repeatedly playing the RF refocusing pulses (the BIREF-1 pulses) the magnetization is repeatedly refocused leading to repeated spin echoes. The peak amplitude of each of the spin echoes is on the T2-decay curve. Without using refocusing pulses the signal would decay much faster with the T2* (T2 star) curve after the initial excitation RF pulse. T2* is the time it takes for the transverse magnetization to decay to 37% of its original magnitude.

Spoiler gradient=a magnetic field gradient pulse applied to effectively remove transverse magnetization by producing a rapid variation of its phase along the direction of the gradient. For the T2prep module it is played after the 90 degrees flip back (also known as tip up) pulse has been played. It destroys remaining transverse magnetization so that after playing the entire T2prep module magnetization is again in the longitudinal direction.

Tip-down pulse=90 degrees pulse (also known as excitation pulse) that brings the longitudinal magnetization into the transverse plane.

Flip-back pulse=a −90 degrees pulse that brings the magnetization back from the transverse plane onto the longitudinal axis.

Segmented data acquisition records the different parts of raw data space (the segments) in a periodic fashion by repeatedly playing out a pulse sequence comprising an inversion pulse sequence and MR data acquisition pulses and acquiring a different set of k-space lines during readout (acquisition).

B0 is the main static base MRI magnetic field.
B1 is the RF transmit coil field.

A system provides B1 and B0-insensitive, flow and motion-robust T2-preparation and T2-preparation combined with inversion recovery. The system provides an adiabatic T2-preparation module (pulse sequence) that prepares tissue magnetization by weighting it according to its T2 values. In the heart, it is used in edema imaging and also for suppression of background tissue in coronary MR angiography. But it can also be used for other organs such as the brain to create T2-weighted MR images. The system gives T2-preparation that is robust in the presence of motion, blood flow, B1- and B0-variations. In contrast, known T2-preparation pulse sequences are either too susceptible to B1- and B0-variations, or to motion and blood flow.

Figure 2:
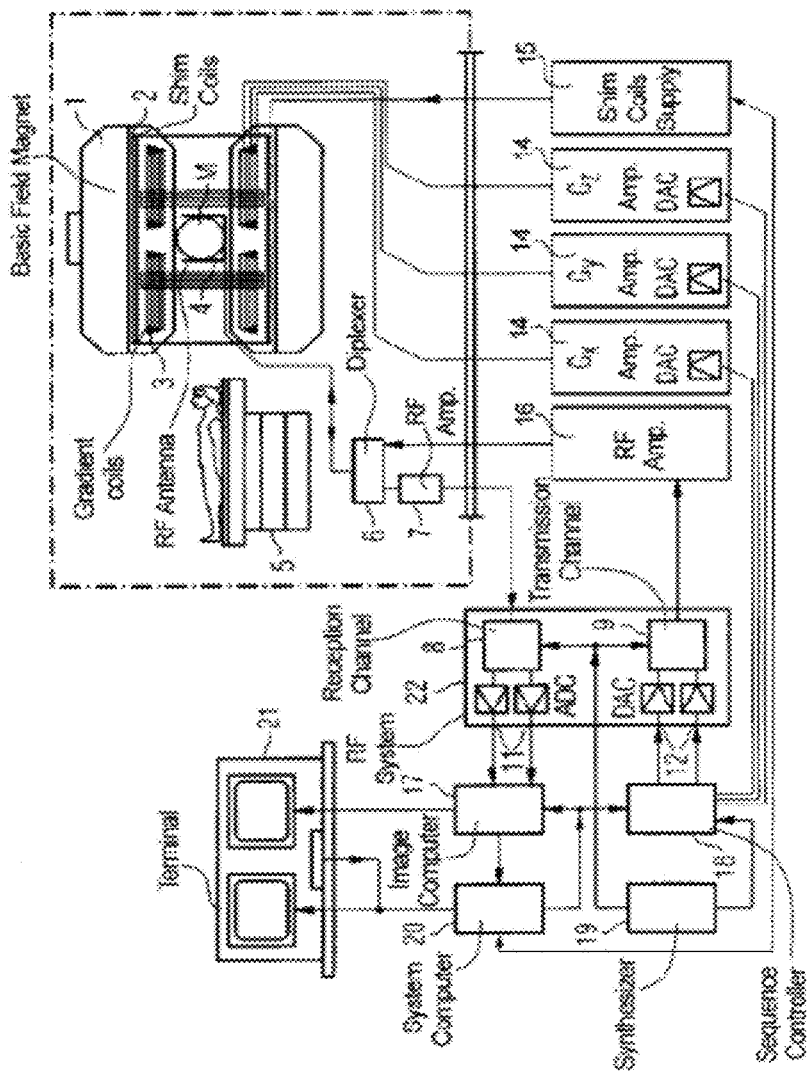
FIG. 2 shows an MR imaging system for discriminating between imaged tissue types based on transverse relaxation time (T2), according to invention principles.

FIG. 2 shows MR imaging system 10 for discriminating between imaged tissue type based on transverse relaxation time (T2). RF coils 4 emit RF pulses to excite nuclear proton spins in measurement volume M and acquire resultant RF echo signals. The correspondingly obtained magnetic resonance signals are demodulated in receiver processing unit 8 of RF system 22 in a phase-sensitive manner, and are converted via respective analog-digital converters 11 into a real part and an imaginary part of the measurement signal and processed by imaging computer 17. Imaging computer 17 reconstructs an image from the processed acquired RF echo pulse data. The processing of RF data, the image data and the control programs is performed under control of system computer 20. In response to predetermined pulse sequence control programs, sequence controller 18 controls generation of desired pulse sequences and corresponding scanning of k-space. In particular, sequence controller 18 controls the switching of the magnetic gradients at appropriate times, transmission of RF pulses with a determined frequency, phase and amplitude and reception of magnetic resonance signals in the form of RF echo data. Synthesizer 19 determines timing of operations of RF system 22 and sequence controller 18. The selection of appropriate control programs for generating an MR image and the display of the generated nuclear spin image is performed by a user via terminal (console) 21, which contains a keyboard and one or more screens.

A signal generator (sequence controller 18) generates a pulse sequence for T2 preparation comprising a number of B1 independent refocusing pulses for refocusing of magnetization of an anatomical region of interest being imaged. RF coils 4 transmit RF pulses in response to the pulse sequence and acquire RF data in response to transmission of the RF pulses. A processing system (imaging computer 17) processes the RF data to provide a display image indicating different tissue types with enhanced discrimination based on T2 relaxation time difference.

Figure 3:
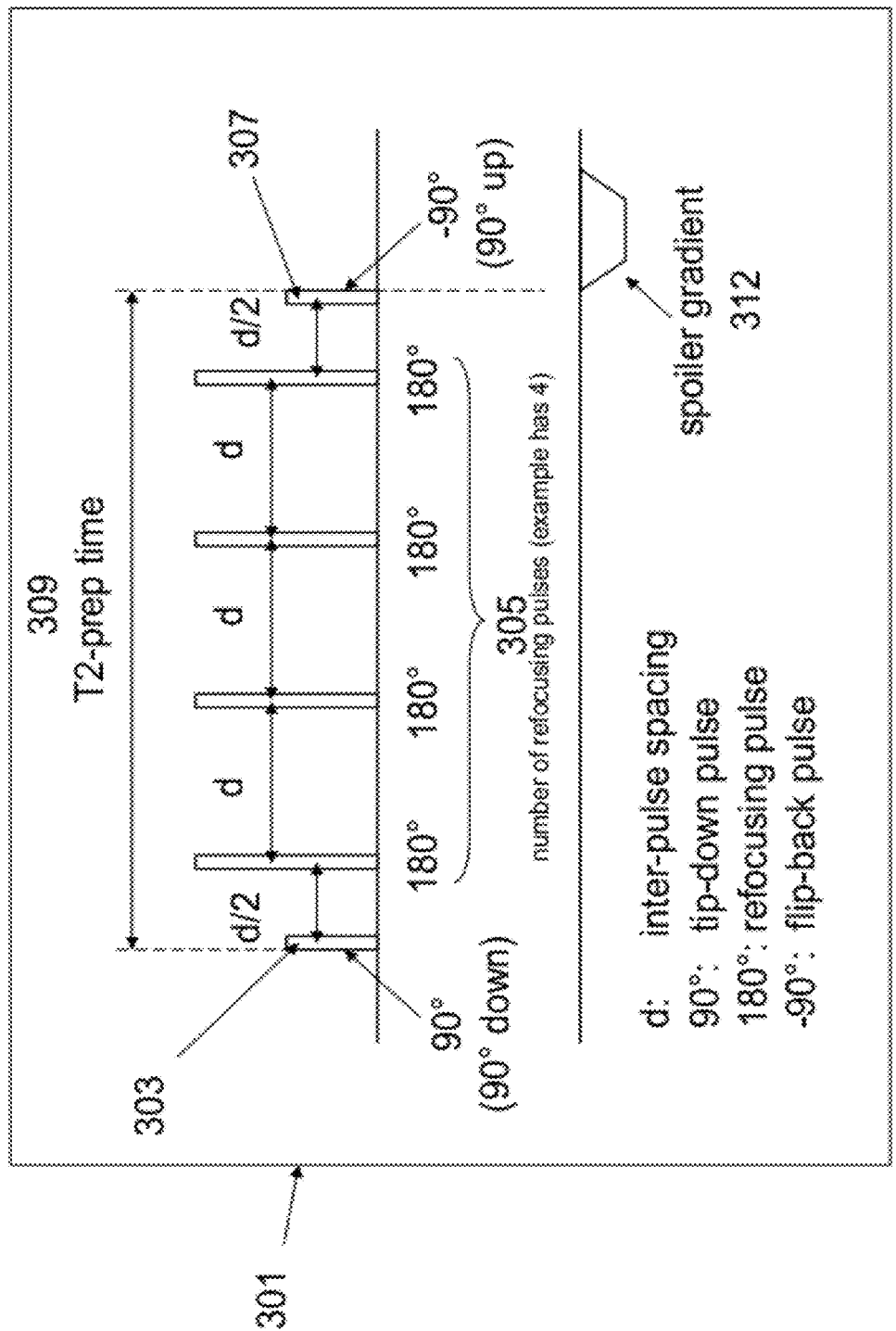
FIG. 3 shows a T2-preparation pulse sequence including a 90° RF (radio frequency) pulse (90° down) that tips down the magnetization from the longitudinal axis into the transverse plane, followed by a series of BIREF-1 refocusing pulses (here 4) and a flip-back pulse of −90° (90° up) that returns the magnetization to the longitudinal axis, according to invention principles.

FIG. 3 shows the building blocks of a generic T2-preparation pulse sequence 301 including a 90° RF (radio frequency) pulse 303 (90° down) that tips down the magnetization from the longitudinal axis into the transverse plane, followed by a series of refocusing pulses 305 (here 4) and a flip-back pulse 307 of −90° (90° up) that returns the magnetization to the longitudinal axis. Pulse sequence 301 is followed by a spoiler gradient pulse 312 comprising a magnetic field gradient pulse applied to effectively remove transverse magnetization by producing a rapid variation of its phase along the direction of the gradient. For the T2-prep module it is played after the 90 degrees flip back (also known as tip up) pulse has been played. It destroys remaining transverse magnetization so that after playing the entire T2prep module magnetization is again in the longitudinal direction. Refocusing pulses 305 are equally spaced by the inter-pulse spacing distance d. The leading and trailing 90° pulses are separated from the respective refocusing pulse by half the inter-pulse spacing distance (d/2). They can be adiabatic, non-adiabatic, or composite pulses, e.g. rectangular pulses. The value of d is a function of the total duration of the RF pulses and time delays between them. It is called T2-prep time 309. Different numbers of refocusing pulses can be used, and the example shows 4. Refocusing pulses applied in known systems are either 1) composite pulses, specifically MLEV (Malcolm Levitt's composite decoupling) pulses, or adiabatic RF pulses.

The known MLEV T2-preparation pulse sequence performs poorly at field strengths of 3 T and higher due to reduced B1 homogeneity at higher field strengths and because of MLEV's inability to completely compensate for B1 variations. There is a trend in clinical MRI to image at higher field strengths undermining the usefulness of MLEV T2-preparation. Known systems address the described B1-inhomogeneity problem at higher fields using adiabatic pulses. Specifically, use of a deconstructed BIR4 (deconstructed B1 insensitive rotation pulse with 4 half passages) and pairs of adiabatic inversion pulses have been described. Unfortunately, these known pulse sequences are adversely affected by motion and blood flow. Consequently, these known pulse sequences yield acceptable image quality of a static phantom, but poor quality in clinical imaging of a beating heart and vessels containing flowing blood, and the image quality degrades with increasing T2-prep time.

System 10 (FIG. 2) advantageously employs BIREF-1 (B1 independent refocusing), adiabatic RF pulses for refocusing magnetization in the context of T2-preparation. BIREF-1 pulses are perceived as being susceptible to off-resonance effects, which is why BIREF-1 pulses are typically not used for clinical imaging. Whereas this may be a problem for MR spectroscopy, the inventors advantageously recognized that it is not for MR imaging when used as part of a T2-preparation. The system provides T2-preparation using optimized BIREF-1 pulses as a core element. BIREF-1 pulses only need two adiabatic half-passages per phase-compensated refocusing event, whereas known systems require four. Therefore, BIREF-1 refocusing events are shorter and require less RF energy. Both properties combined are advantageously used by system 10 to provide a pulse sequence to realize a shorter inter-pulse spacing than previous adiabatic T2-preparation modules (pulse sequences). The system 10 pulse sequences advantageously provide faster refocusing (shorter duration of each phase-compensated refocusing event) paired with shorter inter-pulse spacing to improve motion and flow robustness over known adiabatic T2-prep modules and because these pulses are adiabatic, they are advantageously insensitive to B1-inhomogeneity.

System 10 (FIG. 2) uses optimized BIREF-1 B1-insensitive, motion and flow robust adiabatic RF refocusing pulses as an element of T2-preparation. In addition, the system provides the pulses with sufficiently short inter-pulse spacing advantageously inhibiting introduction of motion and flow sensitivity. Thereby the system overcomes the limitations of known systems and is substantially unaffected by B1-inhomogeneites, motion and blood flow. BIR4 refocusing pulses require twice the energy of BIREF-1 pulses assuming equal adiabaticity. Therefore, in a T2-preparation pulse sequence of equal energy, twice as many refocusing pulses can be played with BIREF-1 compared to BIR4 pulses. This enables shorter inter-pulse spacing and improves described motion-robustness. Another adiabatic pulse, the adiabatic IR pulse (e.g. the Silver-Hoult pulse), has comparable energy to the BIREF-1 pulse, but needs to be played in pairs to function as a phase-compensated refocusing module. This leads to half the refocusing events per module compared to BIREF-1 (assuming equal T2-prep time) making the refocusing process less motion-robust. Also, since only a pair of pulses achieves a phase-compensated refocusing of magnetization, each phase-compensated refocusing event is inherently longer and thus more affected by motion, irrespective of inter-pulse spacing.

For a given power, the system T2-prep module achieves a shorter inter-pulse spacing and a shorter phase-compensated refocusing duration than prior adiabatic modules and thus exhibits improved MR imaging motion and blood flow robustness. In one embodiment, system 10 advantageously provides a combined T2-preparation and inversion pulse sequence. Energy and pulse sequence duration are reduced compared to playing a T2-preparation pulse sequence and a subsequent inversion recovery pulse sequence as separate pulse sequences.

Figure 4:
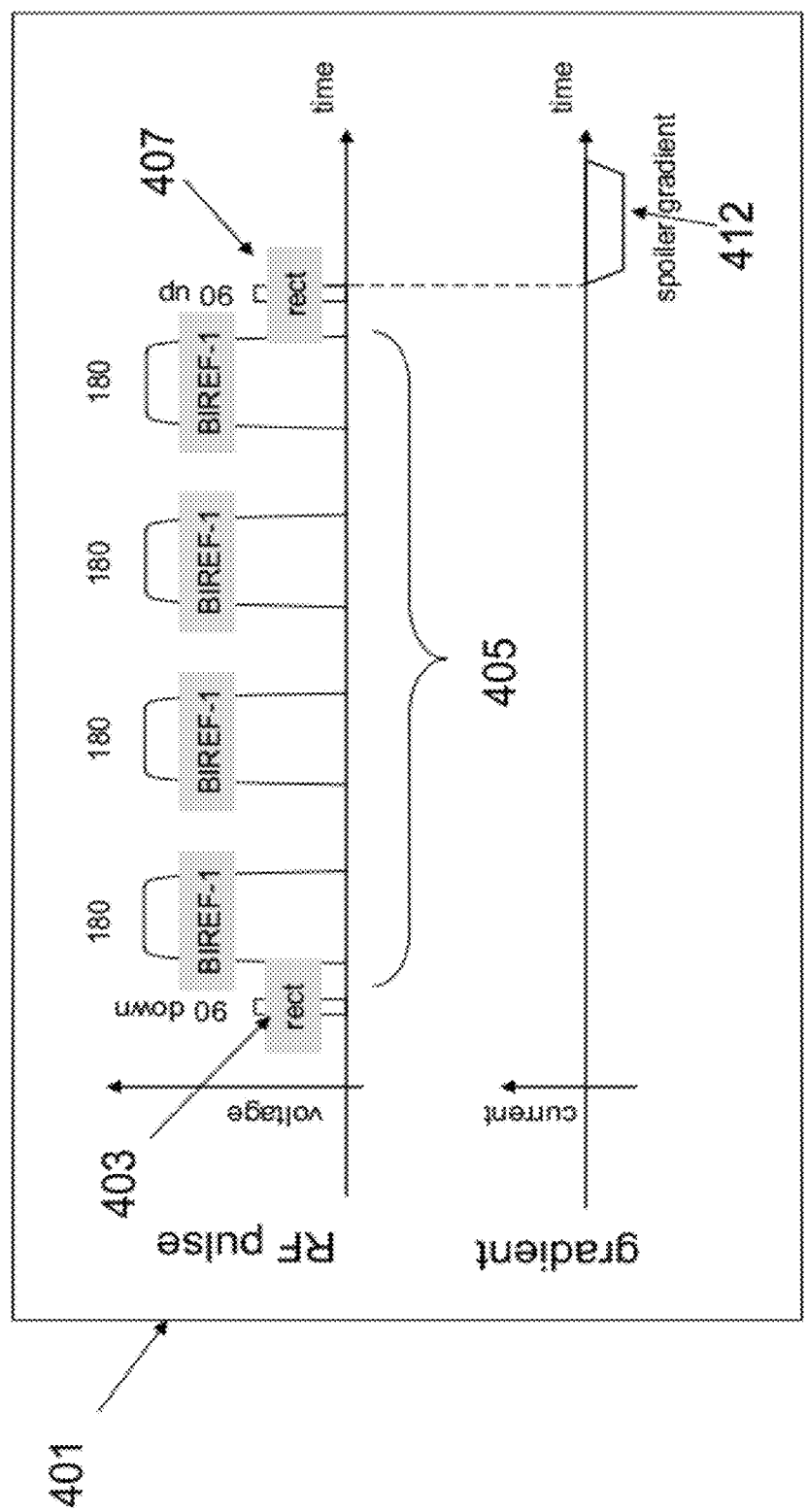
FIG. 4 shows a T2-preparation pulse sequence including a RECT 90° RF (radio frequency) pulse (90° down) that tips down the magnetization from the longitudinal axis into the transverse plane, followed by a series of BIREF-1 refocusing pulses (here 4) and a BIR4 flip-back pulse of −90° (90° up) that returns the magnetization to the longitudinal axis, according to invention principles.

FIG. 4 shows a preferred T2-preparation pulse sequence 401 using the timing of FIG. 3. The pulse sequence 401 includes a rectangular (RECT) 90° RF (radio frequency) pulse 403 (90° down) that tips down the magnetization from the longitudinal axis into the transverse plane, followed by a series of BIREF-1 refocusing pulses 405 (here 4) and a RECT flip-back pulse 407 of −90° (90° up) that returns the magnetization to the longitudinal axis. Pulse sequence 401 is followed by a spoiler gradient pulse 412 comprising a magnetic field gradient pulse applied to effectively remove transverse magnetization. In another embodiment the tip-down and flip-back pulses can be a (non-adiabatic) RECT (rectangular) or an (adiabatic) BIR4 pulse. In another variation, the trailing 90° pulse is a tip-down instead of a flip-back pulse. This constitutes a combined T2-preparation and inversion recovery (T2-prep-IR) module that can be used for combined T2- and T1-weighting, with improved robustness to motion and flow than previous modules. Applications of this modified pulse sequence include, for example, dark-blood delayed enhancement (flow independent delayed enhancement—FIDDLE) and edema imaging, both of which are of value in cardiovascular MR imaging. T2-prep-IR is also used in MRI of the brain.

System 10 (FIG. 2) advantageously uses the BIREF-1 (B1 independent refocusing) adiabatic RF pulses for refocusing magnetization in conjunction with clinical T2-prepared imaging such as the combination of BIREF-1, RECT, and BIR4 pulses. The inventors have advantageously recognized that, in a T2-preparation pulse sequence, a short inter-pulse spacing of the refocusing pulses may be used to improve motion and blood flow robustness, and that such short inter-pulse spacing is advantageously achieved by using BIREF-1 pulses, because they achieve a shorter phase-compensated refocusing duration than other adiabatic pulse used in known systems. The inventors have also recognized that for a given energy of an adiabatic T2-preparation pulse sequence, the pulse sequence is more motion and blood flow robust when using 4 BIREF-1 refocusing pulses than 2 BIR4 or 4 IR pulses, and that refocusing with 2n BIREF-1 pulses is advantageously more robust than with n BIR4 pulses or 2n IR pulses. Furthermore, the inventors have recognized that the use of BIREF-1 refocusing pulses allows use of different numbers of refocusing pulses, not just even numbers as for the matched IR pairs sequence. The system in one embodiment advantageously combines T2prep with inversion recovery (T2-prep-IR) based on the inventor advantageous recognition that the combined T2prep-IR requires a BIR4 pulse as trailing tip-down pulse rather than a simple RECT as this makes for improved homogeneity of the preparation.

Figure 5:
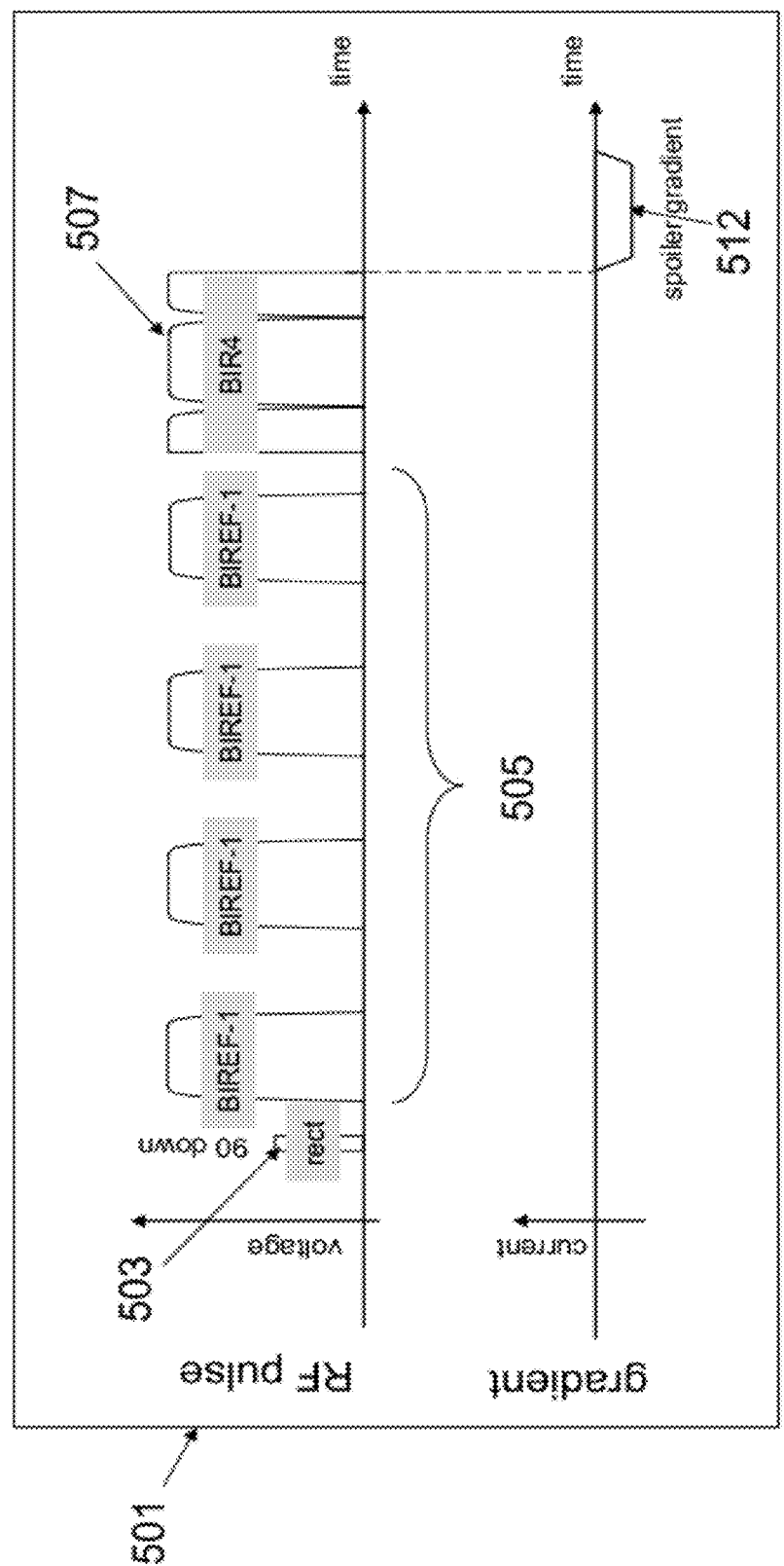
FIG. 5 shows a T2-preparation pulse sequence including a RECT 90° RF (radio frequency) pulse (90° down) that tips down the magnetization from the longitudinal axis into the transverse plane, followed by a series of BIREF-1 refocusing pulses (here 4) and a BIR4 flip-back pulse of −90° (90° up) that returns the magnetization to the longitudinal axis, according to invention principles.

FIG. 5 shows T2-preparation pulse sequence 501 including a RECT 90° RF (radio frequency) pulse 503 (90° down) that tips down the magnetization from the longitudinal axis into the transverse plane, followed by a series of BIREF-1 refocusing pulses 505 (here 4) and a BIR4 flip-back pulse 507 of −90° (90° up) that returns the magnetization to the longitudinal axis. Pulse sequence 501 is followed by a spoiler gradient pulse 512 comprising a magnetic field gradient pulse applied to effectively remove transverse magnetization. In other T2-preparation embodiments, leading tip-down pulse 503 may be a RECT (a non-adiabatic RF pulse) or a BIR4 pulse (adiabatic). Similarly, trailing flip-back pulse 507 may be a RECT (a non-adiabatic RF pulse) or a BIR4 pulse (adiabatic). Different combinations are possible and work very well. The FIG. 4 and FIG. 5 pulse sequences yield good image quality.

Figure 6:
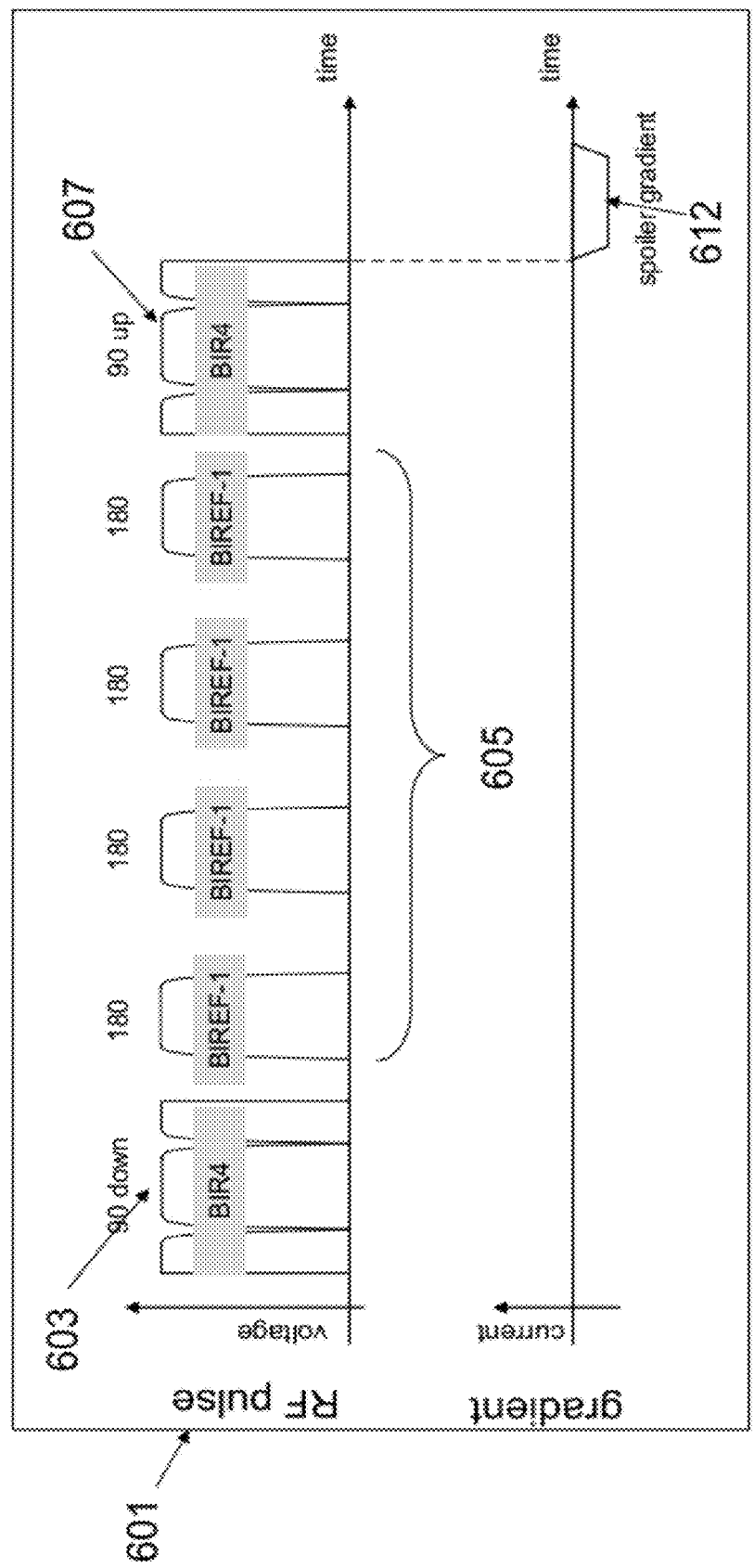
FIG. 6 shows a T2-preparation pulse sequence including a BIR4 90° RF (radio frequency) pulse (90° down) that tips down the magnetization from the longitudinal axis into the transverse plane, followed by a series of BIREF-1 refocusing pulses (here 4) and a flip-back BIR4 pulse of −90° (90° up) that returns the magnetization to the longitudinal axis, according to invention principles.

FIG. 6 shows T2-preparation pulse sequence 601 including a BIR4 90° RF (radio frequency) pulse 603 (90° down) that tips down the magnetization from the longitudinal axis into the transverse plane, followed by a series of BIREF-1 refocusing pulses 605 (here 4) and a flip-back BIR4 pulse 607 of −90° (90° up) that returns the magnetization to the longitudinal axis. Pulse sequence 601 is followed by a spoiler gradient pulse 612 comprising a magnetic field gradient pulse applied to effectively remove transverse magnetization.

Figure 7:
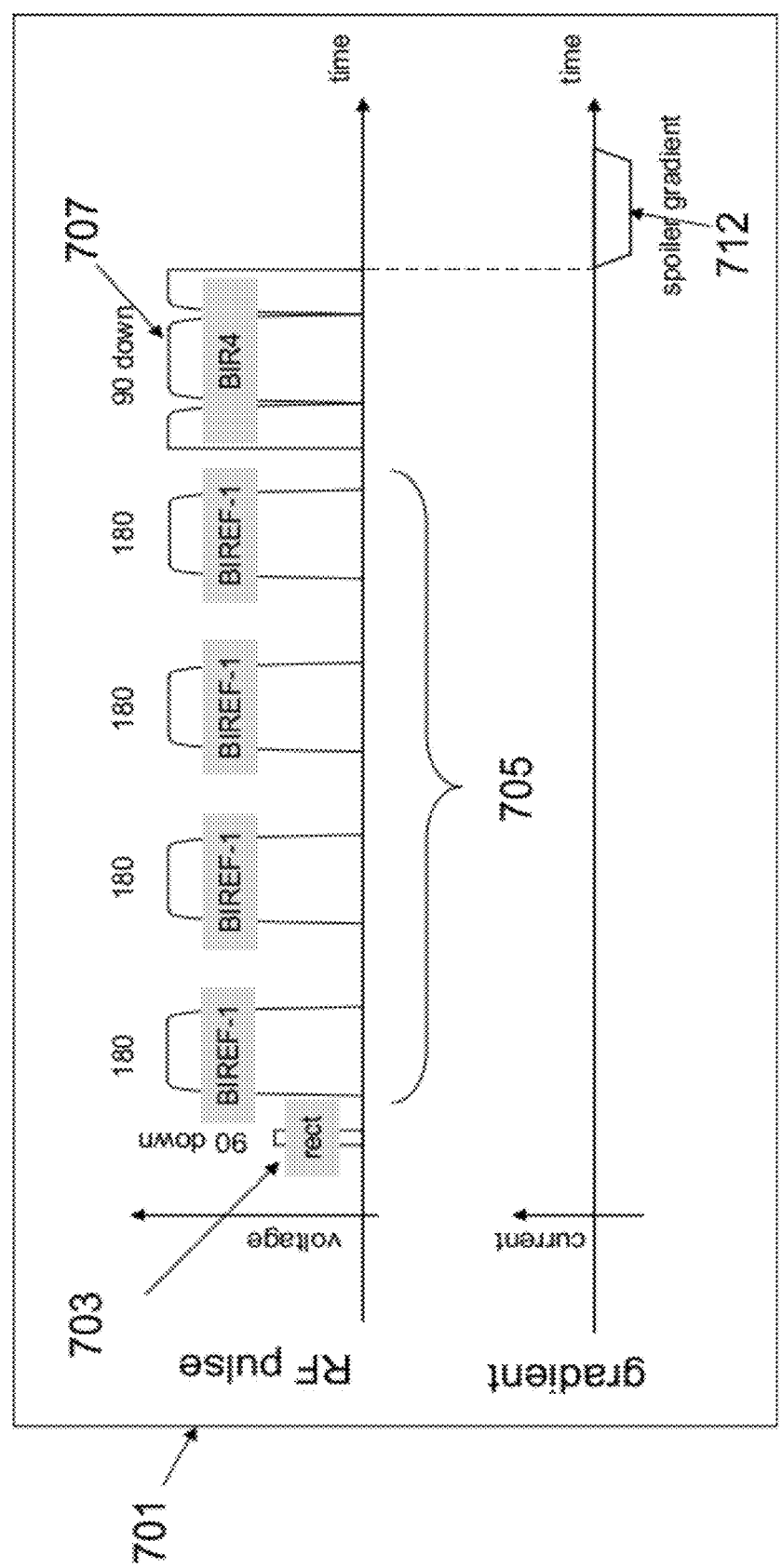
FIG. 7 shows a T2-preparation Inversion Recovery pulse sequence including a RECT 90° RF (radio frequency) pulse (90° down) that tips down the magnetization from the longitudinal axis into the transverse plane, followed by a series of BIREF-1 refocusing pulses (here 4) and a flip-back BIR4 pulse of 90° (90° down) that returns the magnetization to the longitudinal axis, according to invention principles.

FIG. 7 shows T2-preparation Inversion Recovery pulse sequence 701 including a RECT 90° RF (radio frequency) pulse 703 (90° down) that tips down the magnetization from the longitudinal axis into the transverse plane, followed by a series of BIREF-1 refocusing pulses 705 (here 4) and a trailing BIR4 pulse 707 of 90° (90° down) that returns the magnetization to the negative longitudinal axis. Pulse sequence 701 is followed by a spoiler gradient pulse 712 comprising a magnetic field gradient pulse applied to effectively remove transverse magnetization.

Figure 8:
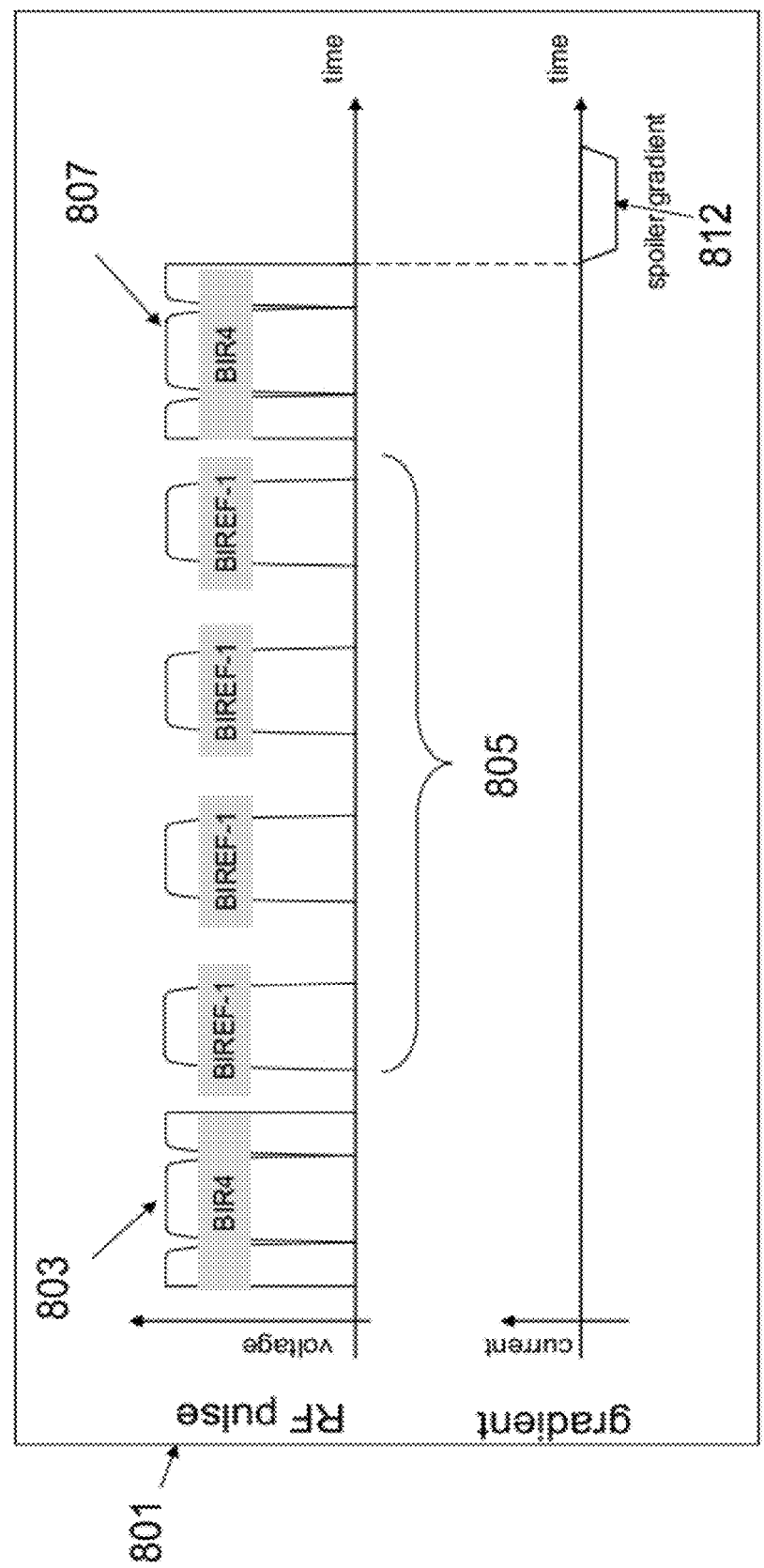
FIG. 8 shows a T2-preparation Inversion Recovery pulse sequence including a BIR4 90° RF (radio frequency) pulse (90° down) that tips down the magnetization from the longitudinal axis into the transverse plane, followed by a series of BIREF-1 refocusing pulses (here 4) and a flip-back BIR4 pulse of 90° (90° down) that returns the magnetization to the longitudinal axis, according to invention principles.

FIG. 8 shows T2-preparation Inversion Recovery pulse sequence 801 including a BIR4 90° RF (radio frequency) pulse 803 (90° down) that tips down the magnetization from the longitudinal axis into the transverse plane, followed by a series of BIREF-1 refocusing pulses 805 (here 4) and a trailing BIR4 pulse 807 of 90° (90° down) that returns the magnetization to the negative longitudinal axis. Pulse sequence 801 is followed by a spoiler gradient pulse 812 comprising a magnetic field gradient pulse applied to effectively remove transverse magnetization. The pulse sequences of FIGS. 3-8 may employ an even or odd number of refocusing pulses. Other pulse sequence embodiments are derived by varying the first and last pulse and by varying the number of refocusing pulses.

System 10 is used in MR imaging of different body parts (neurological, orthopedic, for example), not just the heart and vessels and may be used in MR angiography to homogeneously suppress tissue. The system may be used together with a phase-sensitive imaging method and with different types of readout such as gradient echo (GRE), steady state free precession (SSFP), and turbo-spin echo (TSE) and may be used for flow-independent dark blood delayed enhancement (FIDDLE) and in the absence or presence of contrast agent. The system is usable for single shot and segmented imaging, for 2D and 3D imaging, for Cartesian and radial, elliptical, or any other acquisition trajectory.

Figure 9:
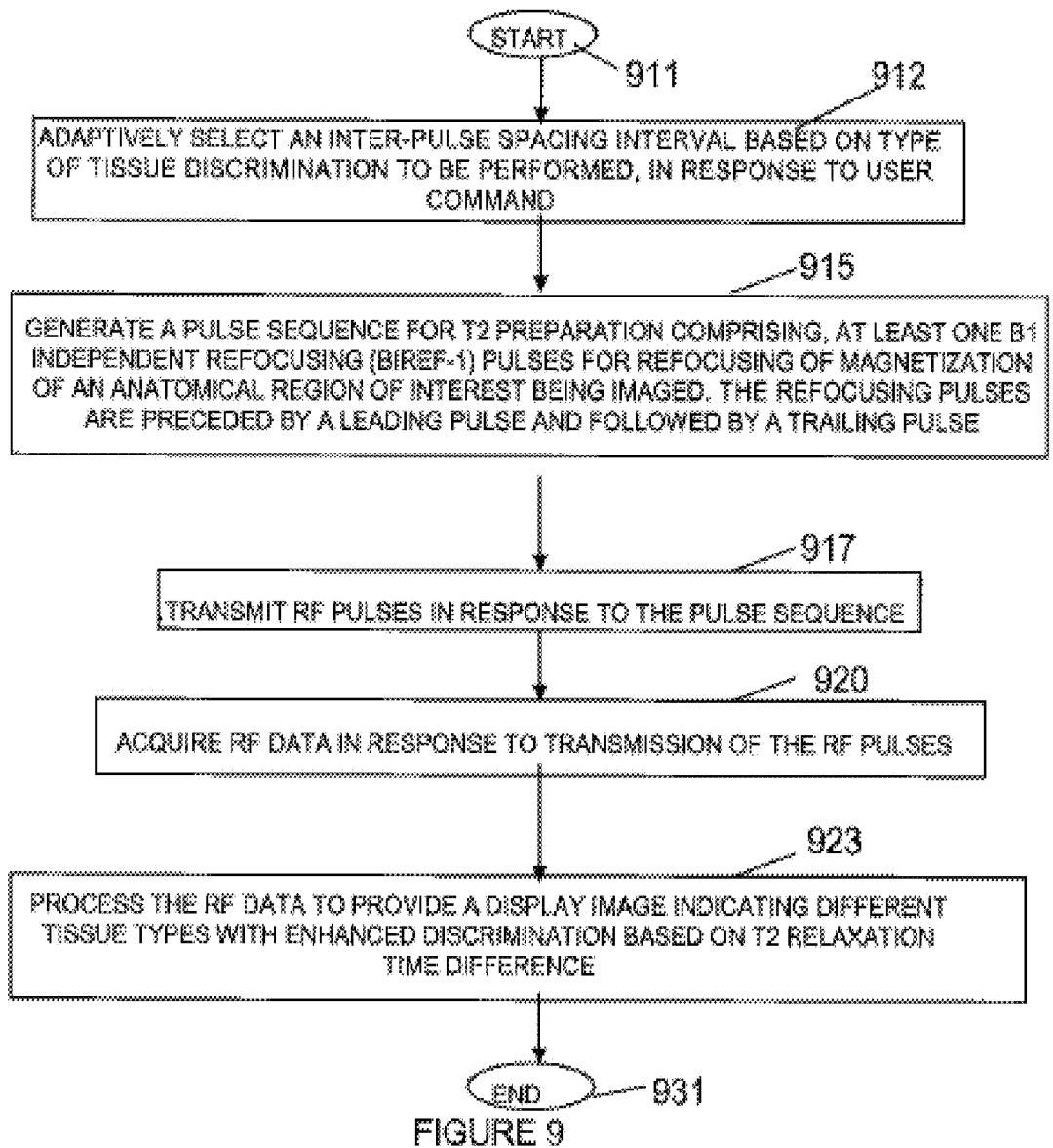
FIG. 9 shows a flowchart of a process performed by an MR imaging system for discriminating between imaged tissue types based on transverse relaxation time (T2), according to invention principles.

FIG. 9 shows a flowchart of a process performed by MR imaging system 10 (FIG. 2) for discriminating between imaged tissue type based on transverse relaxation time (T2). In step 912 following the start at step 911, system computer 20 adaptively selects an inter-pulse spacing interval based on type of tissue discrimination to be performed, in response to user command. In step 915, a signal generator (sequence controller 18) generates a pulse sequence for T2 preparation comprising a number of B1 independent refocusing pulses for refocusing of magnetization of an anatomical region of interest being imaged separated by the selected inter-pulse spacing interval.

The refocusing pulses are preceded by a leading pulse and followed by a trailing pulse separated by substantially half the inter-pulse spacing interval from the refocusing pulses. The trailing pulse in one embodiment comprises a tip-down pulse and is followed by a gradient pulse for substantially reducing transverse magnetization of the anatomical region of interest being imaged. The leading pulse comprises a non-adiabatic pulse, an adiabatic pulse, a rectangular pulse, a B1-insensitive pulse with 4 adiabatic half passages (B1-insensitive rotation, BIR4) pulse, a B1-insensitive pulse with 1 adiabatic half passage pulse or a B1-insensitive pulse with 1 adiabatic fast passage pulse. In one embodiment, the trailing pulse comprises a B1-insensitive pulse with 4 half passages (B1-insensitive rotation, BIR4) pulse and in another embodiment, the trailing pulse comprises a rectangular pulse. The adiabatic refocusing pulses are of type B1-independent refocusing pulses (BIREF-1) separated by the inter-pulse spacing interval.

The inter-pulse spacing interval is substantially constant between successive pairs of adiabatic pulses. In one embodiment, the pulse sequence for T2 preparation comprises an even number of B1 independent refocusing pulses separated by an inter-pulse spacing interval and preceded by a leading longitudinal to transverse magnetization pulse and followed by a trailing transverse to longitudinal magnetization pulse, the leading pulse and trailing pulse are separated by substantially half the inter-pulse spacing interval from the refocusing pulses. RF coils 4 in step 917 transmit RF pulses in response to the pulse sequence and in step 920 acquire RF data in response to transmission of the RF pulses. In step 923, a processing system (imaging computer 17) processes the RF data to provide a display image indicating different tissue types with enhanced discrimination based on T2 relaxation time difference. The process of FIG. 9 terminates at step 931.

Continuing with operation of system 10 (FIG. 2), basic field magnet 1 generates a strong magnetic field, which is constant in time, for the polarization or alignment of the nuclear spins in the examination region of an object, such as, for example, a part of a human body to be examined. The high homogeneity of the basic magnetic field required for the magnetic resonance measurement is provided in a spherical measurement volume M, for example, into which the parts of the human body to be examined are brought. In order to satisfy the homogeneity requirements and especially for the elimination of time-invariant influences, shim-plates made of ferromagnetic material are mounted at suitable positions. Time-variable influences are eliminated by shim coils 2, which are controlled by a shim-current supply 15.

In the basic magnetic field 1, a cylinder-shaped gradient coil system 3 is used, which consists of three windings, for example. Each winding is supplied with current by an amplifier 14 in order to generate a linear gradient field in the respective directions of the Cartesian coordinate system. The first winding of the gradient field system 3 generates a gradient $G_x$ in the x-direction, the second winding generates a gradient $G_y$ in the y-direction, and the third winding generates a gradient $G_z$ in the z-direction. Each amplifier 14 contains a digital-analog converter, which is controlled by a sequence controller 18 for the generation of gradient pulses at proper times.

Within the gradient field system 3, radio-frequency (RF) coils 4 are located which converts the radio-frequency pulses emitted by a radio-frequency power amplifier 16 via multiplexer 6 into a magnetic alternating field in order to excite the nuclei and align the nuclear spins of the object to be examined or the region of the object to be examined. In one embodiment, RF coils 4 comprise a subset or substantially all of, multiple RF coils arranged in sections along the length of volume M corresponding to the length of a patient. Further, an individual section RF coil of coils 4 comprises multiple RF coils providing RF image data that is used in parallel to generate a single MR image. RF pulse signals are applied to RF coils 4, which in response produces magnetic field pulses which rotate the spins of the protons in the imaged body by ninety degrees or by one hundred and eighty degrees for so-called "spin echo" imaging, or by angles less than or equal to 90 degrees for so-called "gradient echo" imaging. In response to the applied RF pulse signals, RF coils 4 receive MR signals, i.e., signals from the excited protons within the body as they return to an equilibrium position established by the static and gradient magnetic fields. The MR signals comprising nuclear spin echo signals received by RF coils 4 as an alternating field resulting from the precessing nuclear spins, are converted into a voltage that is supplied via an amplifier 7 and multiplexer 6 to a radio-frequency receiver processing unit 8 of a radio-frequency system 22.

The radio-frequency system 22 operates in an RF signal transmission mode to excite protons and in a receiving mode to process resulting RF echo signals. In transmission mode, system 22 transmits RF pulses via transmission channel 9 to initiate nuclear magnetic resonance in volume M. Specifically, system 22 processes respective RF echo pulses associated with a pulse sequence used by system computer 20 in conjunction with sequence controller 18 to provide a digitally represented numerical sequence of complex numbers. This numerical sequence is supplied as real and imaginary parts via digital-analog converter 12 in the high-frequency system 22 and from there to a transmission channel 9. In the transmission channel 9, the pulse sequences are modulated with a radio-frequency carrier signal, having a base frequency corresponding to the resonance frequency of the nuclear spins in the measurement volume M. The conversion from transmitting to receiving operation is done via a multiplexer 6. System computer 20 automatically (or in response to user command entered via terminal 21) determines pulse sequence timing parameters for discriminating between MR imaged tissue type based on transverse relaxation time (T2).

A processor as used herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and is conditioned using executable instructions to perform special purpose functions not performed by a general purpose computer. A processor may be coupled (electrically and/or as comprising executable components) with any other processor enabling interaction and/or communication therebetween. A user interface processor or generator is a known element comprising electronic circuitry or software or a combination of both for generating display images or portions thereof. A user interface comprises one or more display images enabling user interaction with a processor or other device.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters. A user interface (UI), as used herein, comprises one or more display images, generated by a user interface processor and enabling user interaction with a processor or other device and associated data acquisition and processing functions.

The UI also includes an executable procedure or executable application. The executable procedure or executable application conditions the user interface processor to generate signals representing the UI display images. These signals are supplied to a display device which displays the image for viewing by the user. The executable procedure or executable application further receives signals from user input devices, such as a keyboard, mouth, light pen, touch screen or any other means allowing a user to provide data to a processor. The processor, under control of an executable procedure or executable application, manipulates the UI display images in response to signals received from the input devices. In this way, the user interacts with the display image using the input devices, enabling user interaction with the processor or other device. The functions and process steps herein may be performed automatically or wholly or partially in response to user command. An activity (including a step) performed automatically is performed in response to executable instruction or device operation without user direct initiation of the activity.

The system and processes of FIGS. 2-9 are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. A system provides magnetic field insensitive, blood flow and motion-robust T2-preparation and T2-preparation combined with inversion recovery pulse sequences that prepare tissue magnetization by weighting it according to its T2 values. Further, the processes and applications may, in alternative embodiments, be located on one or more (e.g., distributed) processing devices on a network linking the units of FIG. 2. Any of the functions and steps provided in FIGS. 2-9 may be implemented in hardware, software or a combination of both.

What is claimed is:

1. An MR imaging system for discriminating between imaged tissue type based on transverse relaxation time (T2), comprising:
 a signal generator for generating a pulse sequence for T2 preparation comprising at least one B1-independent refocusing (BIREF-1) pulse for refocusing of magnetization of an anatomical region of interest being imaged;
 a plurality of RF coils for transmitting RF pulses in response to said pulse sequence and acquiring RF data in response to transmission of the RF pulses; and
 a processing system for processing the RF data to provide a display image indicating different tissue types with enhanced discrimination based on T2 relaxation time difference.

2. A system according to claim 1, wherein
 at least two B1 independent refocusing pulses (BIREF-1) are separated by at least one inter-pulse spacing interval.

3. A system according to claim 2, wherein
 successive inter-pulse spacing intervals are substantially constant.

4. A system according to claim 2, wherein
 said inter-pulse spacing intervals are adaptively selected based on type of tissue discrimination to be performed.

5. A system according to claim 2, wherein
 said at least two B1 independent refocusing pulses (BIREF-1) have a phase cycling scheme.

6. A system according to claim 5, wherein said cycling scheme is substantially an MLEV scheme.

7. A system according to claim 2, wherein
 said pulse sequence for T2-preparation comprises at least two B1 independent refocusing (BIREF-1) pulses separated by an inter-pulse spacing interval and preceded by a leading pulse and followed by a trailing pulse, said leading pulse and trailing pulse being separated by substantially half said inter-pulse spacing interval from said refocusing pulses.

8. A system according to claim 7, wherein
 said leading pulse comprises a non-adiabatic pulse or an adiabatic pulse.

9. A system according to claim 7, wherein
 said leading pulse comprises a rectangular pulse or a B1-insensitive pulse with 4 adiabatic half passages (B1-insensitive rotation, BIR4) pulse.

10. A system according to claim 7, wherein
 said leading pulse comprises a rectangular pulse or a B1 independent pulse with 1 adiabatic half passage pulse.

11. A system according to claim 7, wherein
 said leading pulse comprises a rectangular pulse or a B1 independent pulse with 1 adiabatic fast passage pulse.

12. A system according to claim 2, wherein
 said pulse sequence for T2 preparation comprises at least two B1 independent refocusing (BIREF-1) pulses separated by an inter-pulse spacing interval and preceded by a leading longitudinal to transverse magnetization pulse and followed by a trailing transverse to longitudinal magnetization pulse, said leading pulse and trailing pulse being separated by substantially half said inter-pulse spacing interval from said refocusing pulses.

13. A system according to claim 1, wherein
said pulse sequence for T2 preparation comprises at least one B1 independent refocusing (BIREF-1) pulses and preceded by a leading pulse and followed by a trailing pulse, said trailing pulse being followed by a gradient pulse for substantially reducing transverse magnetization of said anatomical region of interest being imaged.

14. A system according to claim 13, wherein
said trailing pulse comprises a B1-insensitive pulse with 4 half passages (B1-insensitive rotation, BIR4) pulse or a rectangular pulse.

15. A system according to claim 13, wherein
said trailing pulse comprises a non-adiabatic pulse or an adiabatic pulse.

16. A system according to claim 1, wherein
said pulse sequence is for T2 preparation and inversion recovery and comprises any number of B1 independent refocusing pulses and preceded by a leading pulse and followed by a trailing pulse comprising a tip-down pulse.

17. A system according to claim 16, wherein
said trailing tip-down pulse comprises a B1-insensitive pulse with 4 half passages (B1-insensitive rotation, BIR4) pulse.

18. A system according to claim 16, wherein
said trailing pulse comprises a rectangular pulse.

19. An MR imaging system for discriminating between imaged tissue type based on transverse relaxation time (T2), comprising:
a signal generator for generating a pulse sequence for T2 preparation comprising, at least one B1 independent refocusing (BIREF-1) pulses for refocusing of magnetization of an anatomical region of interest being imaged, said refocusing pulses being preceded by a leading pulse and followed by a trailing pulse;
a plurality of RF coils for transmitting RF pulses in response to said pulse sequence and acquiring RF data in response to transmission of the RF pulses; and
a processing system for processing the RF data to provide a display image indicating different tissue types with enhanced discrimination based on T2 relaxation time difference.

20. A system according to claim 19, wherein
at least two B1 independent refocusing (BIREF-1) pulses are separated by at least one inter-pulse spacing intervals and
successive inter-pulse spacing intervals are substantially constant.

21. A system according to claim 19, wherein
said inter-pulse spacing intervals are adaptively selected based on type of tissue discrimination to be performed.

22. A system according to claim 19, wherein
said two or more B1 independent refocusing pulses (BIREF-1) have a phase cycling scheme.

23. A system according to claim 22, wherein said cycling scheme is substantially an MLEV scheme.

24. A method for discriminating between imaged tissue types based on transverse relaxation time (T2) usable by an MR imaging system, comprising the activities of:
generating a pulse sequence for T2 preparation comprising an even number of B1 independent refocusing (BIREF-1) pulses for refocusing of magnetization of an anatomical region of interest being imaged;
transmitting RF pulses in response to said pulse sequence and acquiring RF data in response to transmission of the RF pulses; and
processing the RF data to provide a display image indicating different tissue types with enhanced discrimination based on T2 relaxation time difference.

* * * * *